(12) United States Patent
Fujiyama et al.

(10) Patent No.: US 6,247,579 B1
(45) Date of Patent: Jun. 19, 2001

(54) SUBSTRATE TRANSFER APPARATUS AND METHOD OF SUBSTRATE TRANSFER

(75) Inventors: Shigemi Fujiyama; Mikio Nishibata; Hirohito Sagoh, all of Kanagawa (JP)

(73) Assignees: Tokyo Ohka Kogyo Co., Ltd, Kanagawa; Tazmo Co., Ltd., Okayama, both of (JP)

( * ) Notice: Subject to any disclaimer, the term of this patent is extended or adjusted under 35 U.S.C. 154(b) by 0 days.

(21) Appl. No.: 09/483,239

(22) Filed: Jan. 14, 2000

(30) Foreign Application Priority Data

Jan. 18, 1999 (JP) ................................. 11-008616

(51) Int. Cl.[7] .................................................. B65G 25/00
(52) U.S. Cl. .................... 198/775; 198/468.4; 198/468.6
(58) Field of Search ..................................... 198/773, 775, 198/750.12, 468.4, 468.6; 414/752.1

(56) References Cited

U.S. PATENT DOCUMENTS

| | | | |
|---|---|---|---|
| 3,973,665 | * 8/1976 | Giammanco | 198/775 |
| 4,501,352 | * 2/1985 | Yanagisawa et al. | 198/775 |
| 4,534,695 | * 8/1985 | Stump et al. | 198/775 |
| 4,558,984 | * 12/1985 | Garrett | 198/775 |
| 4,738,577 | * 4/1988 | Schalberger | 198/773 |

FOREIGN PATENT DOCUMENTS

| | | |
|---|---|---|
| 9-270383 | 10/1997 | (JP) . |
| 10-132465 | 5/1998 | (JP) . |

* cited by examiner

Primary Examiner—Joseph E. Valenza
(74) Attorney, Agent, or Firm—Merchant & Gould P.C.

(57) ABSTRACT

A substrate transfer apparatus, for minimizing flexion or bending when transferring a large-sized angular substrate or plate, wherein transfer arms are constructed with holding portions extending in a direction perpendicular to a transfer direction and further holding portions extending in a direction parallel to the transfer direction, respectively. As a result of this, it is possible to suspend the glass substrate W at the four peripheral side portions from below by means of the holding portions of the transfer arms and to move or transfer it suspended in this way.

6 Claims, 3 Drawing Sheets

FIG. 7 (a) Prior Art
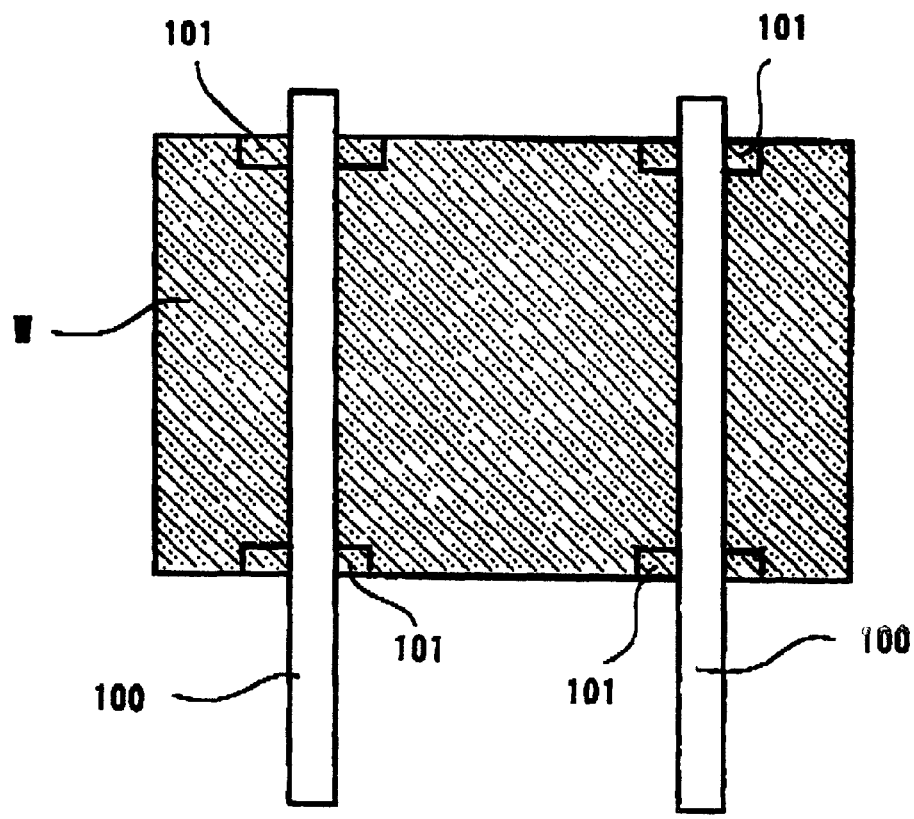
FIG. 7 (b) Prior Art
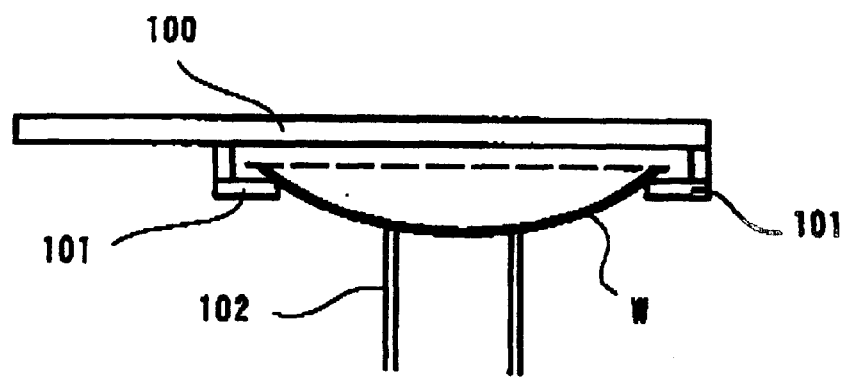

SUBSTRATE TRANSFER APPARATUS AND METHOD OF SUBSTRATE TRANSFER

BACKGROUND OF THE INVENTION

1. Field of the Invention

The present invention relates to a transfer apparatus for transferring an angular substrate or plate, such as a glass substrate or plate for use in a liquid crystal display, for example, and a transfer method thereof.

2. Description of Prior Art

Conventionally, a glass substrate or plate for use in the liquid crystal display is obtained by cutting one large-sized piece of glass plate or substrate, after treating it with processes of applying photo-resist thereon, drying, and further exposing and developing thereof, into glass substrates of sizes as required for a final product.

For applying various types of processes upon such a large-sized glass plate, after completing a process at one process station, it must be transferred to another process station by means of a transfer apparatus.

FIGS. 7(a) and (b) show a plan view and a side view, respectively, of the conventional transfer apparatus, wherein the transfer apparatus is constructed so that hooks 101 . . . are provided on a pair of transfer arms 100 for supporting an angular substrate W at a lower side surface portion thereof.

For transferring the angular substrate W with use of such the transfer apparatus as mentioned above, the transfer arms 100 are arranged to be spaced further apart from each other than the width of the substrate, the height of the apparatus is adjusted so that the hooks 101 . . . of the transfer arms come to be a little bit lower than the angular substrate W which is supported by supporting jigs 102, such as pins, chucks, etc., and next the transfer arms 100 are moved in a horizontal direction so as to move the hooks 101 . . . to a position below the angular substrate W. Thereafter, the transfer arms 100 are lifted up, or alternatively the supporting jigs 102 are lowered, so that the angular substrate W is supported by the hooks 101 . . . and under that condition, the angular substrate W is transferred to the next station by moving the transfer arms 100.

However, the glass substrate or plate for use in the liquid crystal display is thin, having a thickness of, for example, 0.7 mm, has a large planar surface area, and flexes or distorts under it's own weight when suspended in a horizontal plane, hanging downward at the central portion thereof, as shown in FIG. 7(b) In this condition the substrate sometimes interferes with the jigs so that the substrate cannot be transferred, or the flexing brings about a crack in the substrate.

Particularly in recent years the size of the display portion of the typical liquid crystal display has had a tendency to be manufactured to be larger, while at the same time it has become common that a glass plate or substrate having one side exceeding 1.000 mm in length before the cutting thereof is utilized. For example, lifting the glass substrate having the sizes 960 mm×1.100 mm×0.7 mm by means of the conventional transfer apparatus, the substrate is bent or distorted by about 100 mm from the substrate plane at the central portion thereof.

SUMMARY OF THE INVENTION

According to the present invention, for the purpose of dissolving the problems mentioned above, there is provided a substrate transfer apparatus for transferring an angular substrate, comprising:

a pair of transfer arms, being movable in a horizontal direction to be opened or closed, and being movable by sliding in the horizontal direction, each of said pair of transfer arms comprising:

a first holding portion for holding the angular substrate from below, at periphery portion being perpendicular to a transfer direction thereof; add a second holding portion for holding the angular substrate from below, at periphery portion being parallel to the transfer direction thereof.

With such a structure, the curvature at the central portion of the substrate can be suppressed in amount, the substrate can be prevented from interfering with other member(s) and occurrence of cracking therein may be prevented.

In the transfer apparatus as defined in the above, said first and second holding portions are provided in such sizes that they suspend the angular substrate at as close as possible to four complete sides thereof, thereby enabling elevation and transfer of the substrate with a minimum amount of curvature at the central portion thereof.

Also, though the apparatus may be structured such that the pair of transfer arms move only in a horizontal direction while chucks or pins for supporting the substrate move upward or downward, however, by making said pair of transfer arms movable upward or downward, a transfer apparatus of good efficiency and flexibility can be achieved.

Also, with the apparatus being structured such that said pair of transfer arms or a portion of said pair of transfer arms being adjacent to each other are overlapping in a vertical direction, the effective utilization of space can be achieved.

Further, according to the present invention, there is provide a substrate transfer method of employing the substrate transfer apparatus defined in any of the above, comprising the following steps:

supporting an angular substrate from below by means of a supporting jig;

positioning the pair of transfer arm at an elevated position relative to the angular substrate under the condition mentioned above, and opening or separation of the pair of transfer arms to be separated by a distance being greater than a corresponding dimension of the angular substrate, said distance and dimension being oriented in a direction of transfer;

positioning the pair of transfer arms at a lower position relative to the angular plate, and thereafter closing the pair of transfer arms so as to move the transfer arms or portions thereof to be beneath (within the dimension of) the angular substrate, and further lowering the angular substrate with respect to the pair of transfer arms, thereby causing the substrate to rest at a lower periphery portion thereof on the first and second holding portions of the pair of transfer arms; and sliding the pair of transfer arms which hold the angular substrate to move the same, after positioning the supporting jig to be below the pair of transfer arms and thus avoiding interference or collision between the supporting jig and any of the transfer arms upon movement of the latter.

Further, for positioning the pair of transfer arms at a position relatively higher than the angular substrate and also for separating or opening them and for closing or moving them closer to each other with respect to the size of the angular substrate in a direction oriented with the transfer direction, either both or one of the pair of transfer arms may be operated (moved).

BRIEF DESCRIPTION OF THE DRAWINGS

FIGS. 7(a) and (b) show a plan view and a side view of the conventional transfer apparatus, respectively.

DETAILED DESCRIPTION OF PREFERRED EMBODIMENTS

Hereinafter, embodiments according to the present invention will be fully explained with reference to the attached drawings.

Figure 1:
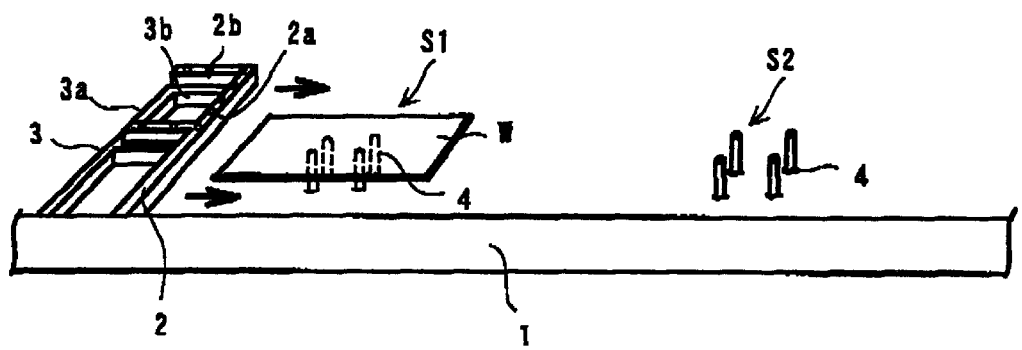
FIG. 1 shows a perspective view of a substrate transfer apparatus according to the present invention, under a waiting or inactive condition thereof.
Figure 2:
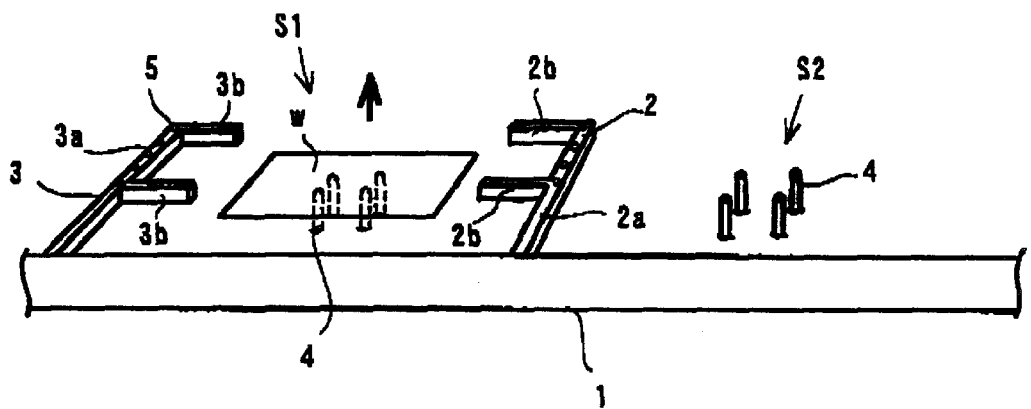
FIG. 2 shows also the perspective view of the same substrate transfer apparatus, but under a condition that a pair of transfer arms thereof are opened.
Figure 3:
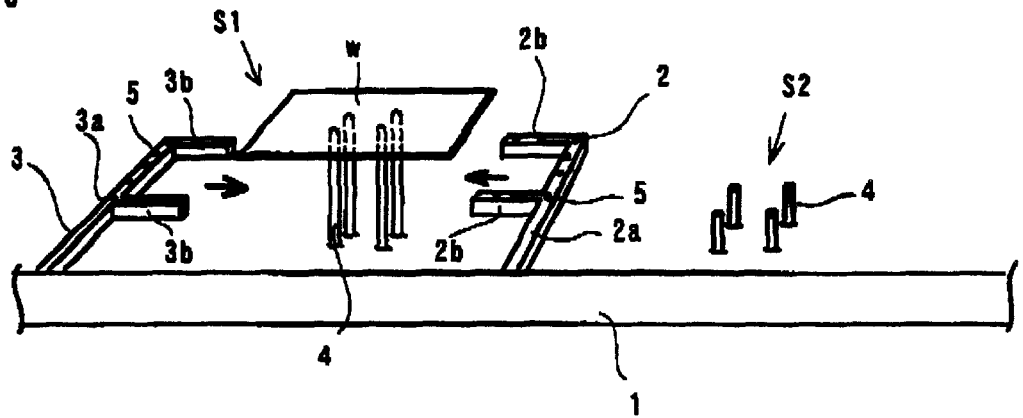
FIG. 3 shows also the perspective view of the same substrate transfer apparatus, but under a condition that the pair of transfer arms are positioned relatively below an angular substrate.
Figure 4:
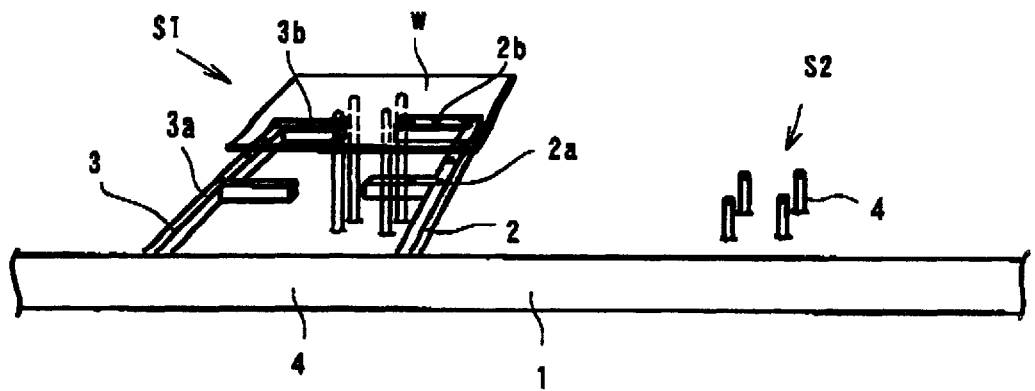
FIG. 4 shows also the perspective view of the same substrate transfer apparatus, but under a condition that the pair of transfer arms are closed or moved relatively together to positions under an angular substrate.
Figure 5:
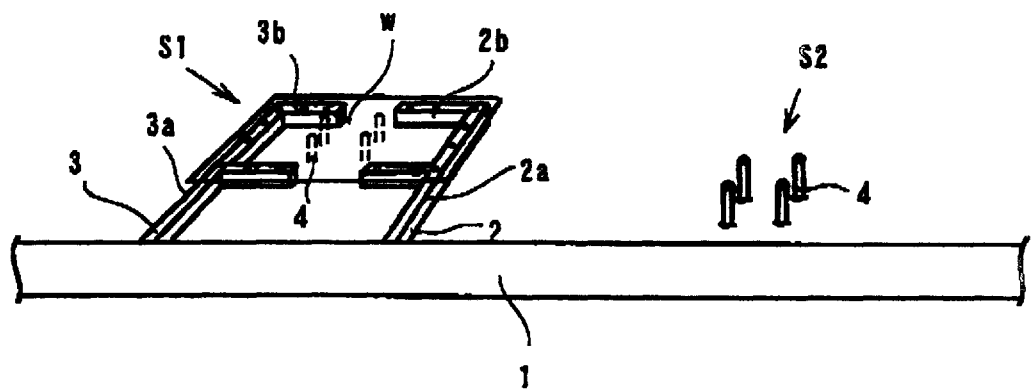
FIG. 5 shows also the perspective view of the same substrate transfer apparatus, but under a condition that the pair of transfer arms are holding or suspending the angular substrate.
Figure 6:
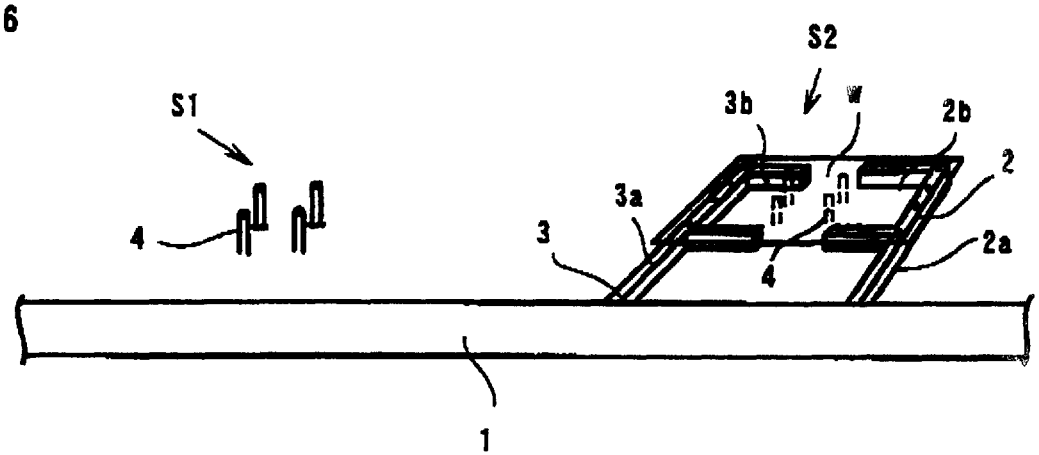
FIG. 6 shows also the perspective view of the same substrate transfer apparatus, but under a condition that the pair of transfer arms are simultaneously slid to move while holding the angular substrate therewith or thereupon.

FIG. 1 shows a perspective view of a substrate transfer apparatus according to the present invention, under a waiting condition thereof; FIG. 2 shows also the perspective view of the same substrate transfer apparatus, but under a condition that a pair of transfer arms thereof are opened; FIG. 3 shows also the perspective view of the same substrate transfer apparatus, but under a condition that the pair of transfer arms are located relatively below an angular plate or substrate; FIG. 4 shows also the perspective view of the same substrate transfer apparatus, but under a condition that the pair of transfer arms are closed or moved relatively together to positions under an angular substrate; FIG. 5 shows also the perspective view of the same substrate transfer apparatus, but under a condition that the pair of transfer arms axe holding or suspending the angular substrate; and FIG. 6 shows also the perspective view of the same substrate transfer apparatus, but under a condition that the pair of transfer arms are slid simultaneously to move while holding the angular substrate therewith or thereupon.

First, in the structure of a transfer apparatus according to the present invention, along process stations S1 and S2 is provided a guide rail 1, and on this guide rail 1 are attached a pair of transfer arms 2 and 3.

A pair of transfer arms are attached to the guide rail 1 in the example shown in this figure, however a plurality of the pair of the transfer arms may be attached thereto.

The transfer arms 2 and 3 comprise first holding portions 2a and 3a extending in a direction perpendicular to a transfer direction, and second holding parts 2b and 3b extending from the holding portions parallel to the transfer direction. The distance between the second holding portions 2b and 2b of the transfer arm 2, and the distance between the second holding portions 3b and 3b of the transfer arm 3, are set to be a little bit shorter than the size of a glass substrate W in a direction of the width thereof, and those second holding portions 2b, 2b, 3b and 3b are extended in such a direction that they face toward each other from their respective corresponding transfer arms. Further, the lengths of the holding portions in a direction as extending from the transfer arms (the transfer direction) are set to be a little bit shorter than a half (½) of the glass substrate W, in the transfer direction.

Further, the transfer arms 2 and 3 can be moved upward or downward, to open or close in a horizontal direction, and to perform sliding to move along with the guide rail 1, independently of each other. However, even if the transfer arms 2 and 3 cannot move upward or downward independently, the glass substrate W can be transferred without any trouble, by manipulating the upward or downward movement of the supporting jigs 4, such as the pins, chucks, etc., minutely.

Next, explanation will be given of a transfer method, assuming the waiting condition shown in FIG. 1 as a starting point. First, under the waiting condition, the transfer arms 2 and 3 with holding portions 2b, 2b, 3b and 3b are overlapping each other in the vertical direction. With this configuration, it is possible to obtain an effective utilization of spaces.

Also, under the waiting condition, the transfer arms 2 and 3 may lie in an position relatively above the glass substrate W.

Next, the one transfer arm 2 is slid to move, passing through the space above the glass substrate W to a position at an opposite side. With this movement, as shown in FIG. 2, the distance between the transfer arms 2 and 3 is made to be longer than the length of the glass substrate W in the direction of transfer.

Next, by lowering the transfer arms 2 and 3, or alternatively by lifting the glass substrate W up, as shown in FIG. 3, the transfer arms 2 and 3 come to be positioned lower than the glass substrate W. Further in this instance, the transfer arms 2 and 3 are aligned in the respective height thereof.

After that, the transfer arms 2 and 3 are closed. Namely, they are shifted to be close to each other in the horizontal direction. An amount of the shifting is determined such that the four side portions of the glass substrate W overlap the first and second holding portions 2a, 2b, 3a and 3b of the transfer arms 2 and 3.

By lifting the transfer arms 2 and 3 up, or alternatively by moving the holding jigs 4 down, the glass substrate W is supported from below at the four side portions thereof by the first and second holding portions of the transfer arms 2 and 3. Namely, the glass substrate W comes to be in a condition that almost all of the periphery of the lower surface of the glass substrate W is supported by the upper surface portions of the holding portions 2a, 2b, 3a and 3b of the transfer arms 2 and 3.

In this instance, since on the holding portions 2a, 2b, 3a and 3b are opened a large number of holes 5 for use of vacuum suction, the vacuum suction is effected at the same time that the glass substrate W is held or suspended, so as to prevent any shifting thereof.

Next, the transfer arms 2 and 3 are moved upward, or alternatively the holding jigs 4 are moved downward, until such a relative position exists between the transfer arms 2 and 3 and the holding jigs 4 that they do not interfere with each other, and as shown in FIG. 6, the transfer arms 2 and 3 are slid to move simultaneously until they reach the process station S2 as a unit, i.e., keeping the relative positions of the transfer arms 2 and 3 constant throughout the sliding or movement to process station S2.

After that, the substrate W is delivered to the holding jigs 4 of the process station S2, by movements of the transfer arms being reversed to those movements mentioned above, and they are returned to the original waiting condition to complete the transfer operation.

As is explained in the above, the substrate transfer apparatus according to the present invention, wherein there are provided the first holding portion for holding the periphery portion of the angular substrate from below, perpendicular to the transfer direction, and the second holding portion for holding the periphery portion of the angular substrate from below, in parallel to the transfer direction, so as to hold or contact as completely as possible the four peripheral portions of the angular substrate from below, thereby suppressing the bending or flexure at the central portion of the substrate, preventing interference with the other members during substrate transfer and preventing cracking or fracture of the suspended or transferred substrate.

As a practical example, when transferring by the conventional transfer apparatus a glass substrate having the dimensions 960 mm×1,100 mm×0.7 mm, a bend of 100 mm deflection from the substrate plane is brought about at the central portion, however this deflection is 10 mm or less when using the transfer apparatus according to the present invention.

Also, at the waiting position, with the configuration in which the pair of the transfer arms or a portion of the pair of transfer arms being adjacent to each other are overlapping in the vertical direction, it is possible to obtain an effective utilization of space.

What is claimed is:

1. A substrate transfer apparatus for transferring an angular substrate, comprising:
    a pair of transfer arms, being movable in a horizontal direction to be opened or closed relative to one another, and being movable by sliding in the horizontal direction, each of said pair of transfer arms comprising:
    a first holding portion for holding the angular substrate from below, at periphery portion being perpendicular to transfer direction thereof; and
    a second holding portion for holding the angular substrate from below, at periphery portion being parallel to the transfer direction thereof .

2. A substrate transfer apparatus as defined in claim 1, wherein said first and second holding portions are of such sizes that they hold the angular substrate at as close as possible to four complete sides thereof.

3. A substrate transfer apparatus as defined in claim 1, wherein said pair of transfer arms are movable upward or downward.

4. A substrate transfer apparatus as defined in claim 1, wherein said pair of transfer arms or a portion of said pair of transfer arms being adjacent to each other may overlap in a vertical direction.

5. A transfer method employing the substrate transfer apparatus defined in claim 1, comprising the following steps:
    supporting an angular substrate from below by means of a supporting jig;
    positioning the pair of transfer arms relatively above the angular substrate under the condition mentioned above, and moving the pair of transfer arms apart relative to each other to a distance of separation between the transfer arms greater than the corresponding dimension of the angular substrate, said distance and dimension being parallel to a transfer direction;
    positioning the pair of transfer arms relatively below the angular substrate, and thereafter closing the distance of separation between the pair of transfer arms, and lowering the angular substrate with respect to the pair of transfer arms, thereby resting the substrate at a lower periphery portion thereof upon the first and second holding portions of the pair of transfer arms; and
    sliding the pair of transfer arms which suspend the angular substrate to move simultaneously, after moving the supporting jig to a position relatively below the pa r of transfer arms.

6. A transfer method as defined in claim 5, wherein the pair of transfer arms are moved relatively apart to a distance of separation greater than the dimension of the angular substrate corresponding to a transfer direction, by causing one among the pair of transfer arms to pass through the space above the angular substrate so as to move to an opposite side thereof.

* * * * *